(12) United States Patent
Kim et al.

(10) Patent No.: US 8,391,347 B2
(45) Date of Patent: Mar. 5, 2013

(54) DECISION FEEDBACK EQUALIZER (DFE) CIRCUITS FOR USE IN A SEMICONDUCTOR MEMORY DEVICE AND INITIALIZING METHOD THEREOF

(75) Inventors: Kyung-Hyun Kim, Gyeonggi-do (KR); Yongsam Moon, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 1129 days.

(21) Appl. No.: 12/261,814

(22) Filed: Oct. 30, 2008

(65) Prior Publication Data
US 2009/0175328 A1     Jul. 9, 2009

(30) Foreign Application Priority Data
Oct. 31, 2007   (KR) .................. 10-2007-0109939

(51) Int. Cl.
*H03H 7/40*     (2006.01)
*H04M 1/64*     (2006.01)

(52) U.S. Cl. ........ 375/229; 375/230; 375/232; 375/233; 379/67.1; 379/68; 379/88.07

(58) Field of Classification Search .......... 375/229–236, 375/227, 285, 284, 295, 316, 346, 348, 350, 375/354, 373–376, 359, 362; 327/2, 7, 9, 327/8, 34, 45, 89, 91, 133, 266, 280, 276, 327/277; 333/18, 282; 708/300, 322, 323; 379/340, 398, 67.1, 68, 88.07
See application file for complete search history.

(56) References Cited

U.S. PATENT DOCUMENTS

| | | | |
|---|---|---|---|
| 5,774,505 A | 6/1998 | Baugh | |
| 6,604,221 B1 | 8/2003 | Ueno | |
| 6,665,337 B1 | 12/2003 | Girardeau, Jr. et al. | |
| 7,583,768 B2 * | 9/2009 | Lee | 375/348 |
| 2003/0137324 A1 * | 7/2003 | Park et al. | 327/55 |
| 2009/0010320 A1 * | 1/2009 | Hollis | 375/232 |

FOREIGN PATENT DOCUMENTS
KR    2005-0065692    6/2005

OTHER PUBLICATIONS
English language abstract of Korean Publication No. 2005-0065692.

* cited by examiner

*Primary Examiner* — Sam K Ahn
*Assistant Examiner* — Linda Wong
(74) *Attorney, Agent, or Firm* — Stanzione & Kim, LLP

(57) ABSTRACT

A DFE circuit for use in a semiconductor memory device and an initializing method thereof. In the method of initializing a DFE circuit used in a semiconductor memory device having a discontinuous data transmission, the DFE circuit may be used for changing a sampling reference level in response to a level of previous data and sampling transmission data. The method includes terminating a data channel having a transmission of the transmission data at a predefined termination level, and controlling a sampling start time point of the transmission data as a time point preceding a transmission time point of the transmission data by a predefined time. Further, an initialization may be performed of the previous data on the basis of initialization data obtained through a pre-sampling of the data channel at a sampling start time point of the transmission data, thereby obtaining an initialization of the DFE circuit and compensating for a feedback delay.

17 Claims, 8 Drawing Sheets

DECISION FEEDBACK EQUALIZER (DFE) CIRCUITS FOR USE IN A SEMICONDUCTOR MEMORY DEVICE AND INITIALIZING METHOD THEREOF

CROSS REFERENCE TO RELATED APPLICATIONS

This application claims priority under 35 U.S.C. §119 from Korean Patent Application 10-2007-0109939, filed on Oct. 31, 2007 the contents of which are hereby incorporated in their entirety by reference.

BACKGROUND

1. Technical Field

The present invention relates to semiconductor memory devices, and more particularly, to a Decision Feedback Equalizer (DFE) circuit for use in a semiconductor memory device and an initializing method thereof, which is capable of initializing the DFE circuit in the semiconductor memory device with a discontinuous data transmission, and of compensating for a feedback delay.

2. Description

Recent developments in the area of semiconductor technology are bringing about an increase of clock frequency and an increase of data transmission rate. Particularly, a data rate between a memory and a memory controller is increasing, causing a distortion in waveforms of data transmitted through a data channel. One such cause is an Inter-Symbol Interference (ISI). The ISI is an effect where previous data have an influence on the currently transmitted data due to a limit of data channel bandwidth.

In one method widely used for reducing the ISI effect, a decision feedback equalizer (DFE) is employed. To normally operate the DFE circuit, previous data needs to be known exactly. For example, when there is an error in a reception of previous data owing to an operation of the DFE circuit or influence of ISI, etc., an incorrect logical operation is performed in receiving current transmission data, causing errors in a reception of the current transmission data. In a relatively worst case, the errors may influence all transmission data bits and so may occur in all reception data.

Further, when the transmission of data is first stopped, and then is again transmitted, errors may occur from a first bit reception of transmission data in view of a characteristic of the DFE circuit since a value of previous data corresponding to a first bit of re-transmitted data has not been decided. To prevent or substantially reduce errors in the reception of transmission data, previous data corresponding to a first bit of transmission data must be recognized in transmitting the data.

In a general high speed serial link communication medium, a protocol decided in the initialization is used, and after the initialization, data is communicated continuously in packets over a data channel. Thus, in the communication medium such as the high speed serial link, previous data can always be known and so it is easy to employ the DFE circuit.

However, a data communication in a semiconductor memory device does not involve the transmission of packets, but is instead a discontinuous communication scheme where the transmission of data and a stop of the transmission are repeated by an input command. In other words, an initialization to define proper previous data corresponding to a first bit is needed at a start time point of data transmission. In a semiconductor memory device, data is transmitted after a given latency when a read/write command is applied. This provides a structure where a data channel does not continuously operate, but data is discontinuously transmitted with a given time gap. A need remains for improved methods of initialization of previous data of the DFE circuit, thereby providing a normal data reception. In addition, the conventional DFE circuit may have limited use due to feedback delays that are not compensated for, thereby resulting in undesirable delays that are not overcome.

SUMMARY

Accordingly, some embodiments of the invention provide a DFE circuit for use in a semiconductor memory device and an initializing method thereof, which is capable of performing a normal operation in employing a DFE circuit in the semiconductor memory device. A data reception error can be prevented or substantially reduced through an initialization of the DFE circuit. Also, some embodiments of the present invention compensate for feedback delays in the DFE circuit such that the delays are overcome. In addition, an influence of ISI in the DFE circuit can be prevented or substantially reduced, and a limit caused by an operating frequency can be substantially lessened.

According to an embodiment of the invention, a method of initializing a DFE circuit used in a semiconductor memory device having a discontinuous data transmission is provided. The DFE circuit may be used for changing a sampling reference level in response to a level of previous data and sampling transmission data. The method may comprise terminating a data channel having a transmission of the transmission data at a predefined specific termination level; and controlling a sampling start time point of the transmission data as a time point preceding by a given time from a transmission time point of the transmission data, and performing an initialization of the previous data on the basis of initialization data got through a pre-sampling of the data channel at a sampling start time point of the transmission data.

The initializing method may further comprise performing a sampling of the transmission data through a sampling reference level changed corresponding to previous data, after performing the initialization.

The sampling start time point of the transmission data may be a time point preceding by at least 1-bit sampling time as 0.5 clock cycle time from a transmission time point of the transmission data.

The sampling start time point of the transmission data may be controlled by at least one signal selected from a mode register set (MRS) signal, address signal and command signal input externally.

The termination level may be a level of power voltage or level of ground voltage. The initialization data may have a level equal or approximate to the termination level.

The termination level may be a specific level existing between the level of power voltage and the level of ground voltage. The termination level may be the same as or approximate to a mean value of the power voltage level and the ground level.

The method may further comprise transmitting a previously-known specific level of initialization data through the data channel and performing an initialization of the previous data, prior to a transmission of the transmission data.

According to another embodiment of the invention, a method of initializing a DFE used in a semiconductor memory device having a discontinuous data transmission, the DFE being for changing a sampling reference level in response to a level of previous data and sampling transmission data, comprises terminating a data channel having a transmission of the transmission data at a predefined specific termination level; and changing a sampling reference level in response to the initialization data and performing a sampling of the transmission data, in an assumption that an initialization data level of the previous data is provided as the termination level.

The termination level may be a power voltage level or ground level.

According to another embodiment of the invention, a DFE circuit for use in a semiconductor memory device for which a data channel having a discontinuous transmission of data is terminated at a specific termination level may comprise: a DFE unit configured to sample transmission data according to a sampling reference level that is configured to change responsive to a level of previous data; and a sampling time point control unit configured to control a sampling start time point of the transmission data of the DFE unit into a time point preceding a transmission time point of the transmission data by a predefined time, wherein the sampling time point control unit is configured to perform an initialization of the previous data by sampling the termination level before sampling of the transmission data.

As described above, according to some embodiments of the invention, errors in a reception of data can be prevented or substantially reduced through an initialization of a DFE circuit in a semiconductor memory device having a discontinuous data transmission. Additionally, structural use limits due to feedback delays can be solved and a limit of operating frequency can be substantially reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

Embodiments of the present invention now will be described more fully hereinafter with reference to FIGS. 1 to 8. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 1 to 8. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
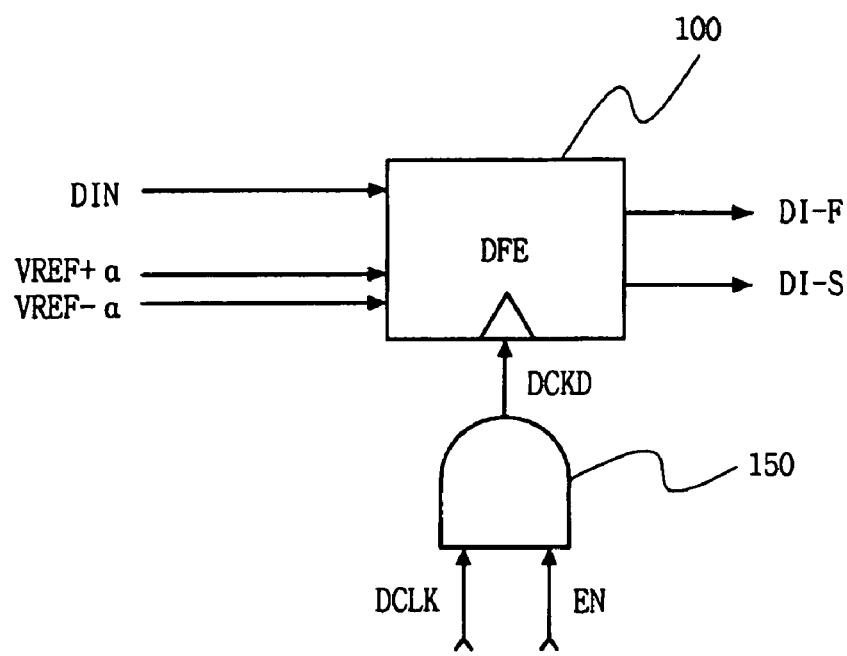
FIG. 1 is a block diagram of DFE circuit according to an embodiment of the invention.
Figure 1:
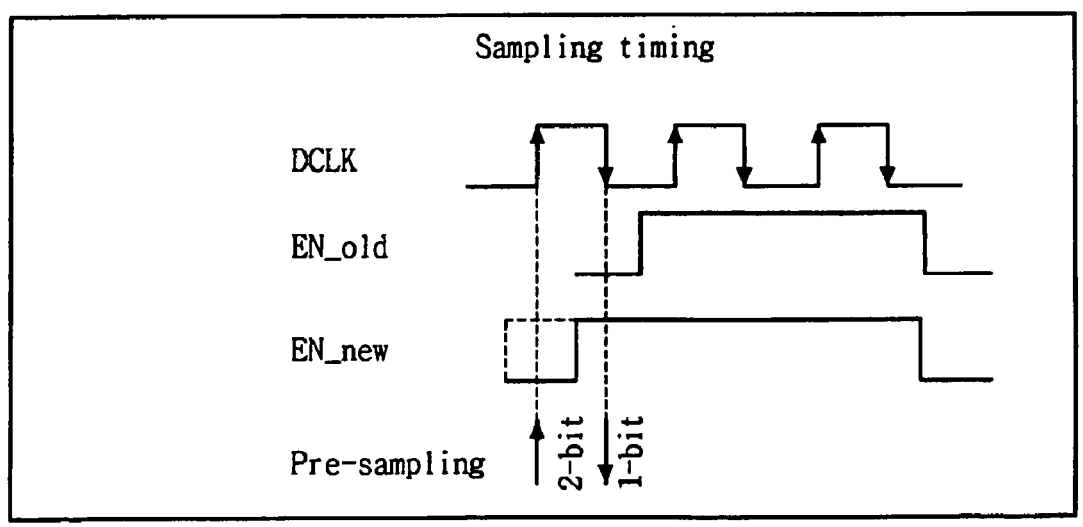

FIG. 1 is a block diagram of DFE circuit in a semiconductor memory device according to an embodiment of the invention. As shown in FIG. 1, a DFE circuit for use in a semiconductor memory device according to an embodiment of the invention includes a DFE unit 100 and a sampling time point control unit 150.

When at present in a semiconductor memory device, a read/write command is applied, data is transmitted after a given latency. That is, a data channel does not continuously operate, but data is transmitted discontinuously with a given time gap according to some cases.

In Double Data Rate 3 (DDR3) memory, a smallest time gap between continuous data transmissions is about 3~4 Unit Interval (UI), wherein the UI is a unit of data. In DRAM, which is generally used as a memory system, a termination of a data channel is performed inside the DRAM die. As a result, the data channel can sufficiently reach a level of the termination within time of 3~4 UI.

The termination level of a data channel may be a level of power voltage VDDQ or level of ground voltage VSSQ. As another example, the termination level may be a specific level existing between the level of power voltage VDDQ and the level of ground voltage VSSQ, for example, a level equal or approximate to a mean level value of the power voltage level VDDQ and the ground level VSSQ as a medium level value VREF therebetween.

The DFE unit 100 samples and outputs transmission data according to sampling reference level that is configured to change responsive to a level of previous data (i.e., data previously input). It is assumed in the following description that when an initial value of the sampling reference level is a mean level VREF of the power voltage level VDDQ and the ground level VSSQ, previous data input just before to the DFE unit 100 has a high level and subsequent transmission data is input.

In this case, a sampling reference level for sampling of the transmission data is changed corresponding to a level of the previous data, and at this time, the sampling reference level has a level VREF+α higher than the mean level VREF of the power voltage level VDDQ and the ground level VSSQ. When the transmission data has a high level, the transmission data is rarely influenced by the previous data having the high level. However, when the transmission data has a low level, the transmission data is strongly influenced by the previous data having the high level, resulting in a high error occurrence probability in performing a sampling with a mean level of the power voltage level VDDQ and the ground level VSSQ. In order to compensate the error occurrence probability, the level VREF+α higher than the mean level may be used.

Conversely, when the previous data has a low level, the sampling reference level for a sampling of the transmission data has a level VREF−α lower than the mean level VREF of the power voltage level VDDQ and the ground level VSSQ in the same principle described above. When the transmission data has a low level, the transmission data is rarely influenced by the previous data having the low level. However, when the transmission data has a high level, the transmission data is strongly influenced by the previous data having the low level, resulting in a high error occurrence probability in performing a sampling with a mean level of power voltage level VDDQ and the ground level VSSQ. In order to compensate the error occurrence probability, the level VREF−α lower than the mean level may be used.

The sampling reference level VREF may be variable and is generally a mean level of the power voltage level VDDQ and the ground level VSSQ, but other levels may be used. For example, when the power voltage level VDDQ is 3V and the ground level VSSQ is 0V, 1.5V may become a reference level. According to some cases, the sampling reference level VREF+α or VREF−α may be decided by adding/deducting proper coefficients, i.e., 'α' with the standard of 1V or 2V.

In the following description it is assumed that a reference level VREF becoming the reference of the sampling reference level VREF+α or VREF−α is a mean level of the power voltage level VDDQ and the ground level VSSQ.

The DFE unit 100 may perform the sampling of transmission data DIN using a sampling reference level VREF+α and VREF−α changed according to a level of previous data, and may output an output signal DI-F and DI-S. Thus, in the DFE unit 100, a level of previous data is provided and used in the sampling of transmission data.

The sampling time point control unit 150 controls a sampling start time point of transmission data of the DFE unit 100 to have a start time point preceding a transmission time point of the transmission data by a predefined time, thereby performing an initialization of the previous data. The sampling time point control unit 150 may comprise an AND circuit having as an input a clock signal DCLK and an enable signal EN, and thus generates a sampling clock DCKD. At this time, a sampling start time point of the transmission data is controlled as the enable signal EN has a high or low level at a specific time point. The sampling start time point of the transmission data can be decided appropriately in comparison with a transmission time point of the transmission data. The sampling start time point of transmission data may be decided corresponding to a previous data value necessary to recognize the transmission data by the DFE unit 100.

As an example, as shown in sampling timings in a lower part of FIG. 1, when the DFE unit 100 needs only previous data of 1-bit, i.e., in the case of 1-tap DFE, the sampling time point is controlled by a new enable signal EN_new, which may have a high level at a time point when the enable signal EN precedes a conventional enable signal EN_old. Thus, the sampling start time point of transmission data may be decided as a time point preceding the conventional sampling time point by 1-bit sampling time (0.5 clock cycle time). When previous data of 2-bits are needed, the sampling start time point of transmission data may be decided as a time point preceding a sampling start time point of the conventional sampling time point of transmission data by 2-bit sampling time (1 clock cycle time). In this case, a time point when new enable signal EN_new has a high level can be brought forward contrary to the case of 1-bit sampling time (referred to by a dotted line).

In summarizing the description, the sampling time point control unit 150 brings a data sampling start time point forward rather than using a sampling start time point of transmission data for sampling the transmission data actually transmitted. Then, the sampling time point control unit 150 samples a termination level of a data channel. Thus, an initialization of previous data may be performed. Here the sampling for an initialization of previous data is called a pre-sampling for the sake of distinction from a sampling of original transmission data.

The sampling start time point of transmission data may be controlled through at least one signal selected among an MRS signal, address signal, and command signal that are input externally, or may be controlled through a combined signal of at least two signals among the signals. The sampling start time point of transmission data may be controlled by selecting or combining one or more signals of various signals used in other semiconductor memory devices.

Figure 2:
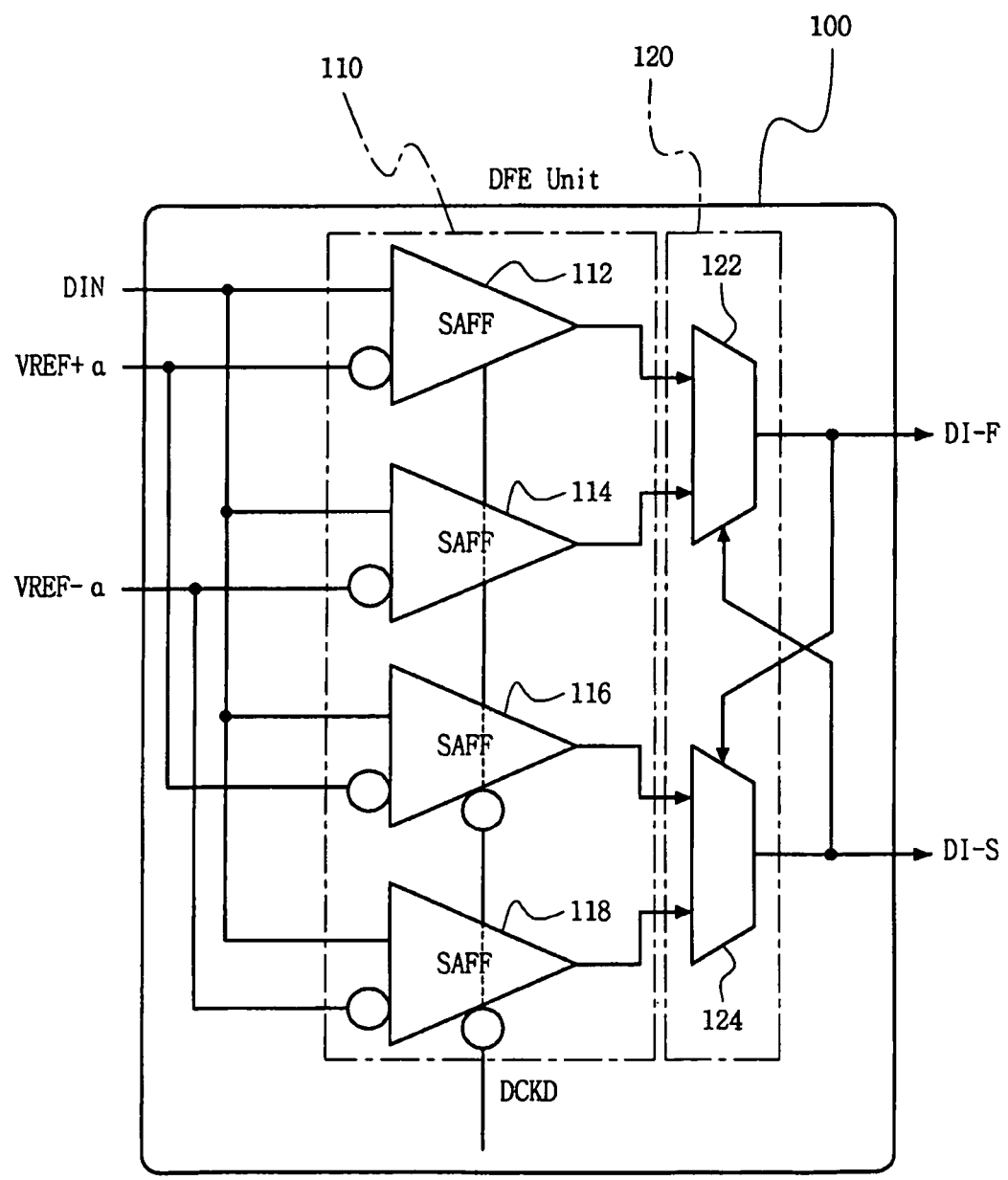
FIG. 2 provides an example of DFE unit shown in FIG. 1.

FIG. 2 provides an example of DFE unit 100 shown in FIG. 1. As shown in FIG. 2, the DFE unit 100 comprises a sampling block 110 and a selection block 120. The sampling block 110 selects a sampling reference level corresponding to the previous data among a plurality of sampling reference levels VREF+α and VREF−α having different levels in response to at least one sampling clock DCKD, and performs a sampling of the transmission data DIN. The sampling block 110 may comprise first to fourth samplers 112, 114, 116, and 118.

The first to fourth samplers 112, 114, 116, and 118 may have as a common input the transmission data DIN. Alternatively, sampling reference levels for the sampling or clocks may be different from one another. The first to fourth samplers 112, 114, 116, and 118 decide a level of data DIN input using a sampling reference level having a given standard, and then perform the sampling of the data.

For example, the first and second samplers 112 and 114 may perform a sampling in response to a first sampling clock DCKD, and the third and fourth samplers 116 and 118 may perform a sampling in response to a second sampling clock, i.e., an inverse clock of the first sampling clock, having a given phase difference from the first sampling clock DCKD.

The first sampling clock and the second sampling clock may be one sampling clock DCKD having a time point of a rising edge and falling edge. In other words, at a rising edge time point of one sampling clock DCKD, the first and second samplers 112 and 114 may operate, and at a falling edge time point, the third and fourth samplers 116 and 118 may operate. Here an example using one sampling clock DCKD is described.

Further, the first and third samplers 112 and 116 may perform a sampling with a first sampling reference level VREF+α as an input thereof, and the second and fourth samplers 114 and 118 may perform a sampling with a second sampling reference level VREF−α as an input thereof. Here, the first sampling reference level VREF+α may have a level value higher by a predefined level than the second sampling reference level VREF−α.

The selection block 120 selects and outputs at least one of the outputs of the sampling block 110. The selection block 120 may comprise at least first and second MUXs 122 and 124. The first MUX 122 selects and outputs any one output signal DI-F from output signals of the first sampler 112 and the second sampler 114 in response to an output signal of the second MUX 124. The second MUX 124 selects and outputs any one output signal DI-S from output signals of the third sampler 116 and the fourth sampler 118 in response to an output signal of the first MUX 122.

Operation of the DFE unit 100 is described in brief as follows. Using an assumption that the transmission data DIN is input having a high level data 1 and a low level data 0, data 1 having a high level is input in common to first to fourth samplers 112, 114, 116, and 118. At a rising edge time point of the sampling clock DCKD, the first and second samplers 112 and 114 operate to sample the data 1 having a high level. Outputs of the first and second samplers 112 and 114 are input to the first MUX 122. At this time, the data 1 having a high level selects any one of outputs of the first and second samplers 112 and 114 in response to an output DI-S of the second MUX 124 as previous data input just before. In this case, when the previous data DI-S has a high level, an output of the second sampler 114 is selected, and when the previous data DI-S has a low level, an output of the first sampler 112 is selected. Then, an output DI-F of the first MUX 122 becomes a high level.

In due time, the data 0 having a low level is input. The data 0 having a low level is input at a falling edge time point of the sampling clock DCKD. Thus the sampling is performed by operation of the third and fourth samplers 116 and 118. Outputs of the third and fourth samplers 116 and 118 are input to the second MUX 124, and the second MUX 124 selects an output of the third sampler 116 in response to a data signal having a high level as the output DI-F of the first MUX 122, and outputs it as output signal DI-S. For example, when the output DI-F of the first MUX 122 has a low level, an output of the fourth sampler 118 is selected and output as the output signal DI-S. As a result, in the sampling reference level, a data value sampled with a standard of reference level higher than a general case is selected. Thus, when previous data has a high level and then subsequent data has a low level, it is possible to prevent or substantially reduce errors, which may be caused by an ISI effect, in sampling the data having the low level.

As described above, in the DFE unit 100, a sampling of subsequently transmitted transmission data is influenced corresponding to a value of previous data and thus an initialization of previous data is very important.

Figure 3:
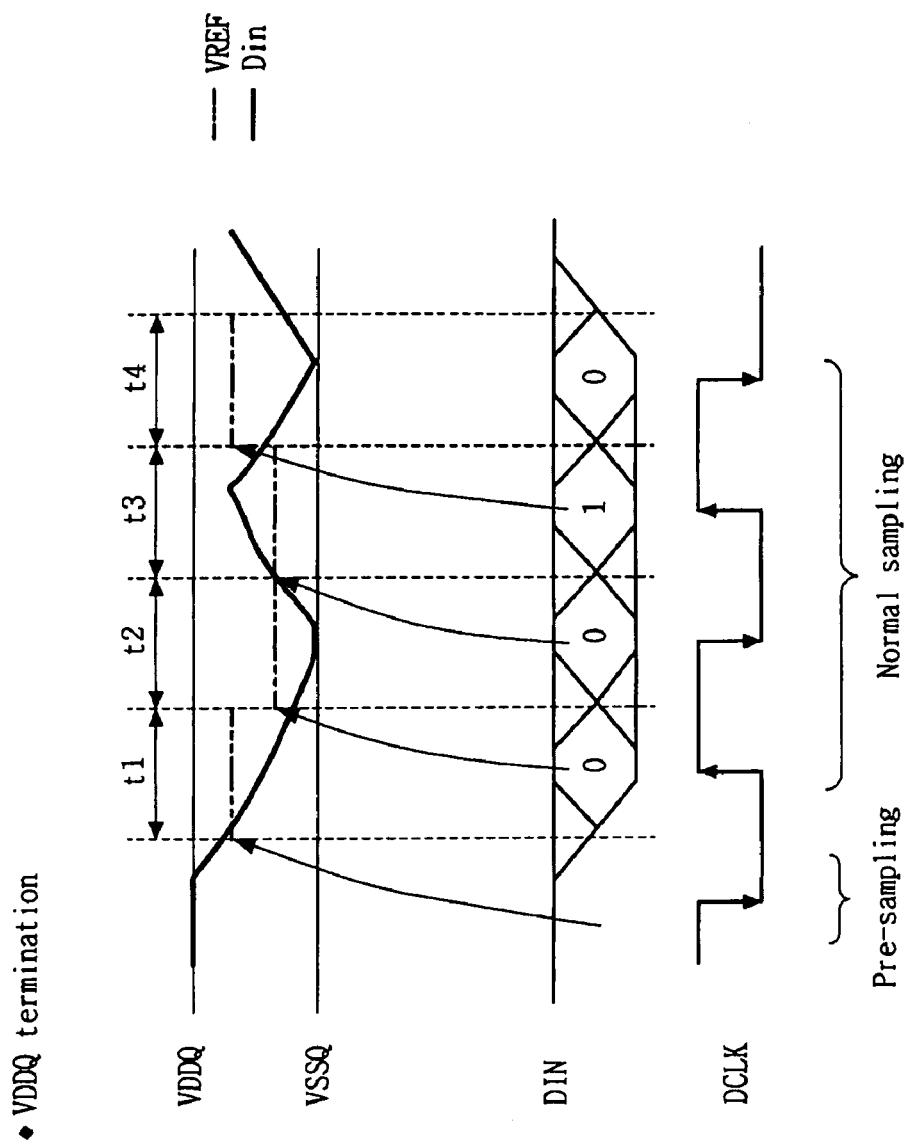
FIGS. 3 and 4 illustrate sampling timings of FIG. 1.

FIG. 3 provides timing information for data sampling operations when a data channel is terminated at a power voltage level VDDQ, i.e., a termination level of data channel is provided as the power voltage level VDDQ. As shown in FIG. 3, the data channel terminated at the power voltage level VDDQ is first sampled for an initialization of data at a pre-sampling section. Then, the previous data is initialized as having a high level as a state of data 1. After that, transmission data of '0,0,1,0' are sequentially input. Data sampling occurs at respective data transmission sections t1, t2, t3 and t4.

For the sampling of data 0 at the transmission section t1 in the state in which the previous data has been initialized to the high level, a first sampling reference level VREF+α is selected. And then, for the sampling of data 0 at the transmission section t2, a second sampling reference level VREF−α lower than the first sampling reference level VREF+α is selected. At the transmission section t2, since previous data is data 0, the relatively low sampling reference level is selected.

At a next transmission section t3, previous data is data 0 and transmission data becomes data 1. In this case, the second sampling reference level VREF−α becomes a sampling reference level. Subsequently, in the transmission section t4, previous data is data 1, and transmission data becomes data 0. In this case, like the transmission section t1, first sampling reference level VREF+α becomes a sampling reference level.

Figure 4:
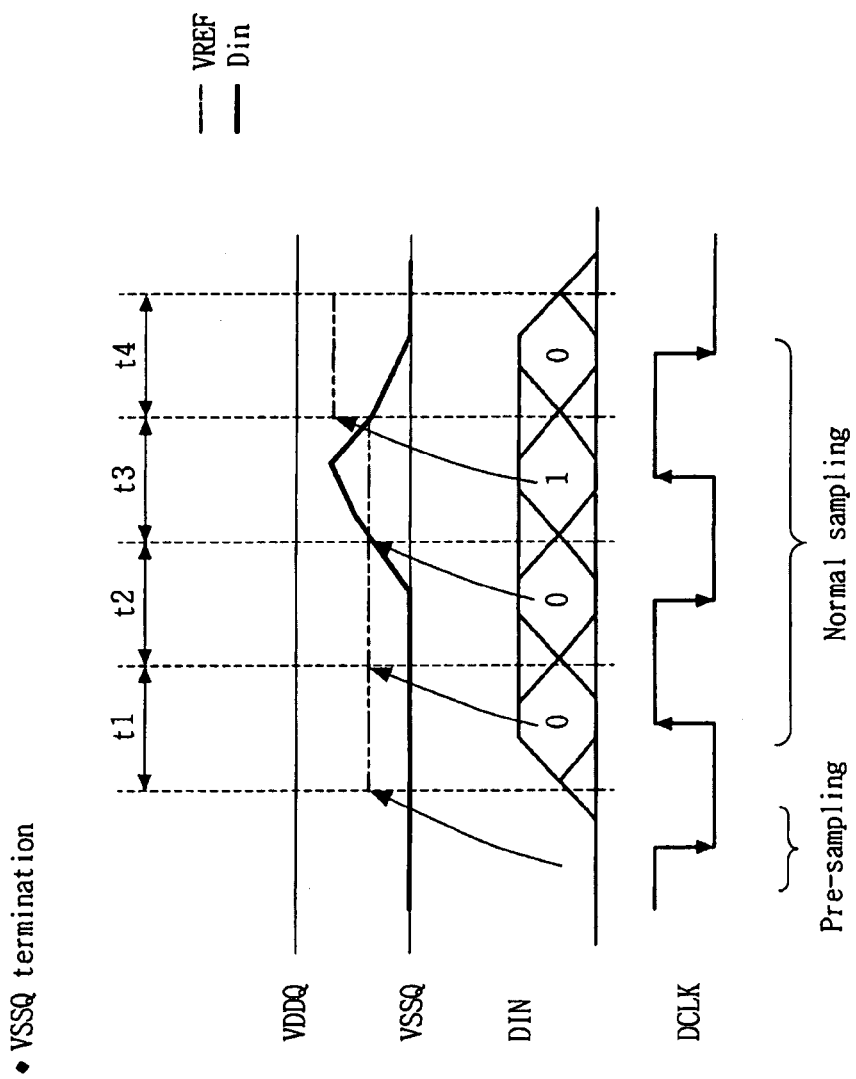

FIG. 4 provides timing information for data sampling operations when a data channel is terminated at ground level VSSQ, i.e., a termination level of data channel is provided as the ground level VSSQ. As shown in FIG. 4, the data channel terminated at the ground level VSSQ is previously sampled for an initialization of data at a pre-sampling section. Then, the data channel terminated at the ground level VSSQ is sampled. The previous data is initialized as having a low level as data 0. After that, transmission data of '0,0,1,0' are sequentially input. The data sampling occurs at respective data transmission sections t1, t2, t3 and t4.

For the sampling of data 0 at the transmission section t1 in the state in which the previous data has been initialized to the low level, the second sampling reference level VREF−α is selected. And then, for the sampling of data 0 at the transmission section t2, the second sampling reference level VREF−α is selected. At a next transmission section t3, previous data is data 0 and transmission data becomes data 1. In this case, the second sampling reference level VREF−α is selected.

Subsequently, at a transmission section t4, previous data becomes data 1 and transmission data becomes data 0. In this case, unlike other transmission sections t1, t2 and t3, first sampling reference level VREF+α will become a sampling reference level.

The first sampling reference level VREF+α and second sampling reference level VREF−α in FIG. 3 and the first and second sampling reference levels VREF+α and VREF−α in FIG. 4 are shown with the sample reference numbers, but these notations are used for description purposes, and may indicate mutually different levels. Further, a value of 'α' may be changed to reflect various values.

Though not shown in the drawing, the termination level of a data channel may be a specific level existing between power voltage level VDDQ and ground level VSSQ. For example, the termination of the data channel may be performed by the same level or approximate level to a mean level value VREF of power voltage level VDDQ and the ground level VSSQ as a medium level value of power voltage level VDDQ and ground level VSSQ.

In this case, the previous data may be initialized through a method of previously transmitting initialization data of a predefined specific level through the data channel prior to a transmission of the transmission data. That is, the initialization data may be transmitted at a pre-sampling section, thereby performing the initialization of previous data.

Figure 5:
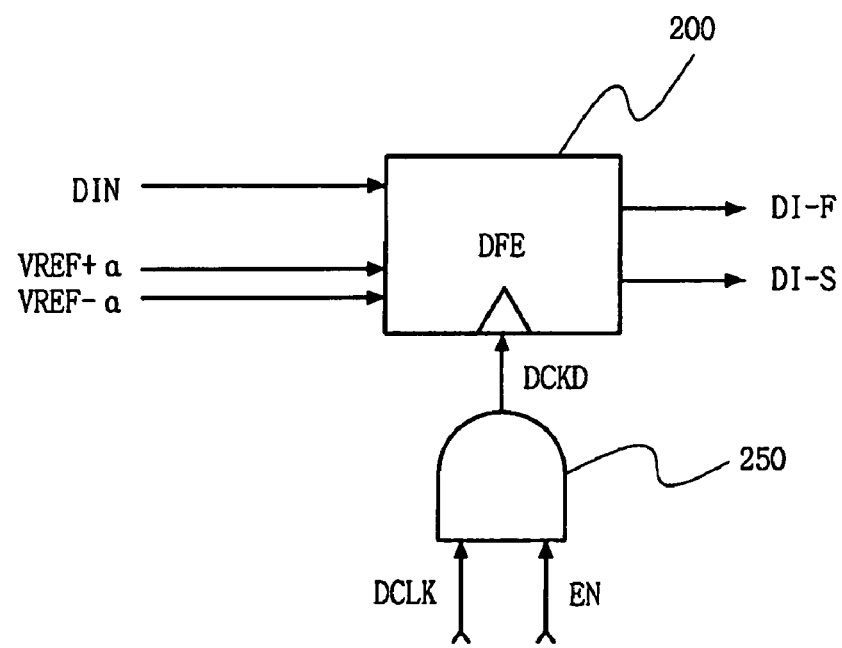
FIG. 5 is a block diagram of DFE circuit according to another embodiment of the invention.
Figure 5:
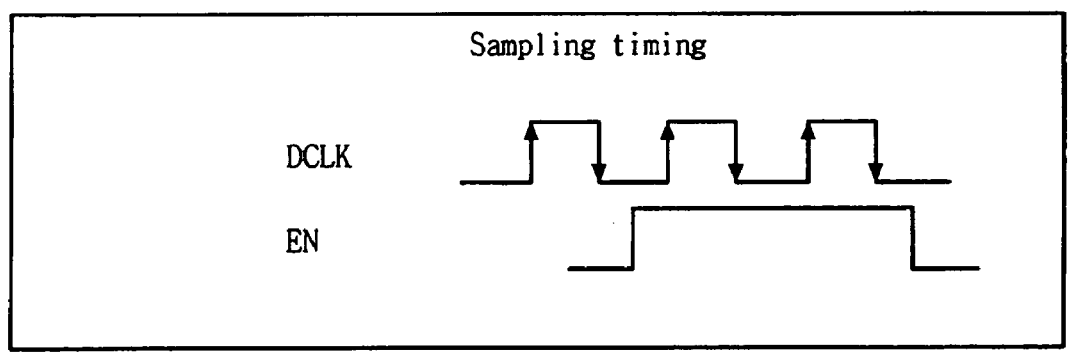

FIG. 5 is a block diagram of a DFE circuit for initializing the previous data without controlling a sampling time point shown in FIG. 1 according to another embodiment of the invention. As shown in FIG. 5, a DFE circuit for use in a semiconductor memory device according to another embodiment of the invention comprises a DFE unit 200 and a sampling clock generating unit 250. The data channel is assumed to be terminated at power voltage level VDDQ or ground level VSSQ.

The DFE unit 200 samples and outputs transmission data according to sampling reference level that is configured to change responsive to a level of previous data (i.e., that is previously input).

For example, it is assumed herein that an initial value of a reference level is a mean level VREF of the power voltage level VDDQ and the ground level VSSQ and that previous data input just before to the DFE unit 200 has a high level and subsequent transmission data is input.

In this case, a sampling reference level for sampling of the transmission data is changed corresponding to a level of the previous data, and at this time, the sampling reference level has a level VREF+α higher than the mean level VREF of power voltage level VDDQ and the ground level VSSQ. When the transmission data has a high level, the transmission data is rarely influenced by the previous data having the high level. However, when the transmission data has a low level, the transmission data is strongly influenced by the previous data having the high level, resulting in a high error occurrence probability in performing a sampling with a mean level of the power voltage level VDDQ and the ground level VSSQ. In order to compensate the error occurrence probability, the level VREF+α higher than the mean level may be used.

The DFE unit 200 may perform a sampling of transmission data DIN using a sampling reference level VREF+α and VREF−α changed according to a level of previous data, and may output an output signal DI-F and DI-S. Thus, in the DFE unit 200, a level of previous data is provided and used in the sampling the transmission data.

A detailed configuration related to the initialization of previous data of DFE unit 200 is described with reference to FIG. 6. The sampling clock generating unit 250 generates a sampling clock DCKD of the sampling time point such as that shown in a lower part of FIG. 5. That is, as illustrated in FIGS. 1 to 3, the sampling is performed without specifically determining a pre-sampling section.

The sampling clock generating unit 250 may generate sampling clock DCKD, including an AND circuit having as an input a clock signal DCLK and an enable signal EN. At this time, as the enable signal EN has a high or low level at a specific time point, a sampling time point of the transmission data is controlled.

Figure 6:
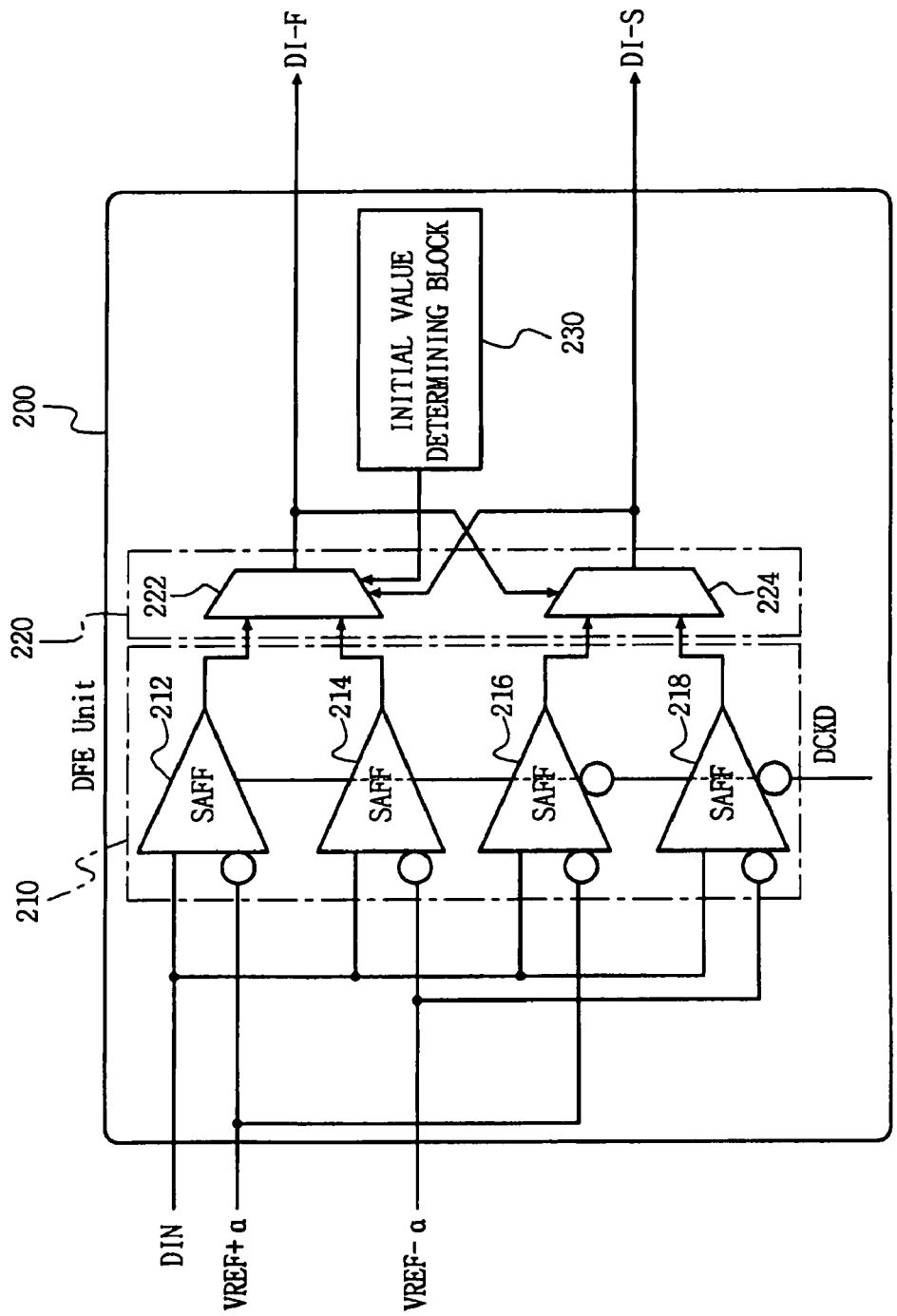
FIG. 6 provides an embodiment of DFE circuit shown in FIG. 5.

FIG. 6 provides an embodiment of DFE unit 200 shown in FIG. 5. As illustrated in FIG. 6, the DFE unit 200 comprises a sampling block 210 and a selection block 220, and an initial value determining block 230. In the DFE unit 200 shown in FIG. 6, normal operations except the configuration and operation of the initial value determining block are substantially the same as described above. In other words, the operations except for an initialization step of the previous data are the same.

The sampling block 210 receives a plurality of sampling reference levels VREF+α and VREF−α having different levels in response to at least one sampling clock DCKD, and performs a sampling of the transmission data DIN. The sampling block 210 may comprise first to fourth samplers 212, 214, 216, and 218.

The first to fourth samplers 212, 214, 216, and 218 may have as a common input the transmission data DIN. Alternatively, sampling reference levels for the sampling or clocks may be different from one another. The first to fourth samplers 212, 214, 216, and 218 decide a level of data DIN input using a sampling reference level having a given standard, and then perform the sampling of the data.

For example, the first and second samplers 212 and 214 may perform a sampling in response to first sampling clock DCKD, and the third and fourth samplers 216 and 218 may perform a sampling in response to second sampling clock, i.e., an inverse clock of the first sampling clock, having a given phase difference from the first sampling clock DCKD.

The first sampling clock and the second sampling clock may be one sampling clock DCKD having a time point of a rising edge and falling edge. In other words, at a rising edge time point of one sampling clock DCKD, the first and second samplers 212 and 214 may operate, and at a falling edge time point, the third and fourth samplers 216 and 218 may operate. Here an example using one sampling clock DCKD is described.

Further, the first and third samplers 212 and 216 may perform a sampling with first sampling reference level VREF+a as an input thereof, and the second and fourth samplers 214 and 218 may perform a sampling with second sampling reference level VREF−α as an input thereof. Here, the first sampling reference level VREF+α may have a level value higher by a predefined level than the second sampling reference level VREF−α.

The selection block 220 selects and outputs at least one of the outputs of the sampling block 210. The selection block 220 may comprise at least first and second MUXs 222 and 224. The first MUX 222 selects and outputs any one output signal DI-F from output signals of the first sampler 212 and the second sampler 214 in response to an output signal of the second MUX 224. The second MUX 224 selects and outputs any one output signal DI-S from output signals of the third sampler 216 and the fourth sampler 218 in response to an output signal of the first MUX 222.

The initial value determining block 230 is configured to initialize the previous data. Specifically, when the data channel is terminated at power voltage level VDDQ, an initial value of the previous data is assumed as having a high level, i.e., data 1. In this case, instead of an output signal of the second MUX 224 input for a control of the first MUX 222, a signal having a high level output from the initial value determining block 230 is input for a control of the first MUX 222. That is, the previous data is initialized as having a high level. The subsequent operation is the same as described above. In other words, the initial value determining block 230 operates to initialize previous data only at a first bit input time point of the transmission data DIN.

Conversely, when the data channel is terminated at ground level VSSQ, an initial value of the previous data is assumed as having a low level, i.e., data 0. In this case, instead of an output signal of the second MUX 224 input for a control of the first MUX 222, a signal having a low level output from the initial value determining block 230 is input for a control of the first MUX 222. That is, the previous data is initialized as having a low level. The subsequent operation is the same as described above, as illustrated with reference to FIG. 2.

According to some embodiments of the invention, when transmission data is input and an initial value of previous data is necessary for a control of the second MUX 224, an output signal of the initial value determining block 230 may be input to the second MUX 224.

Figure 7:
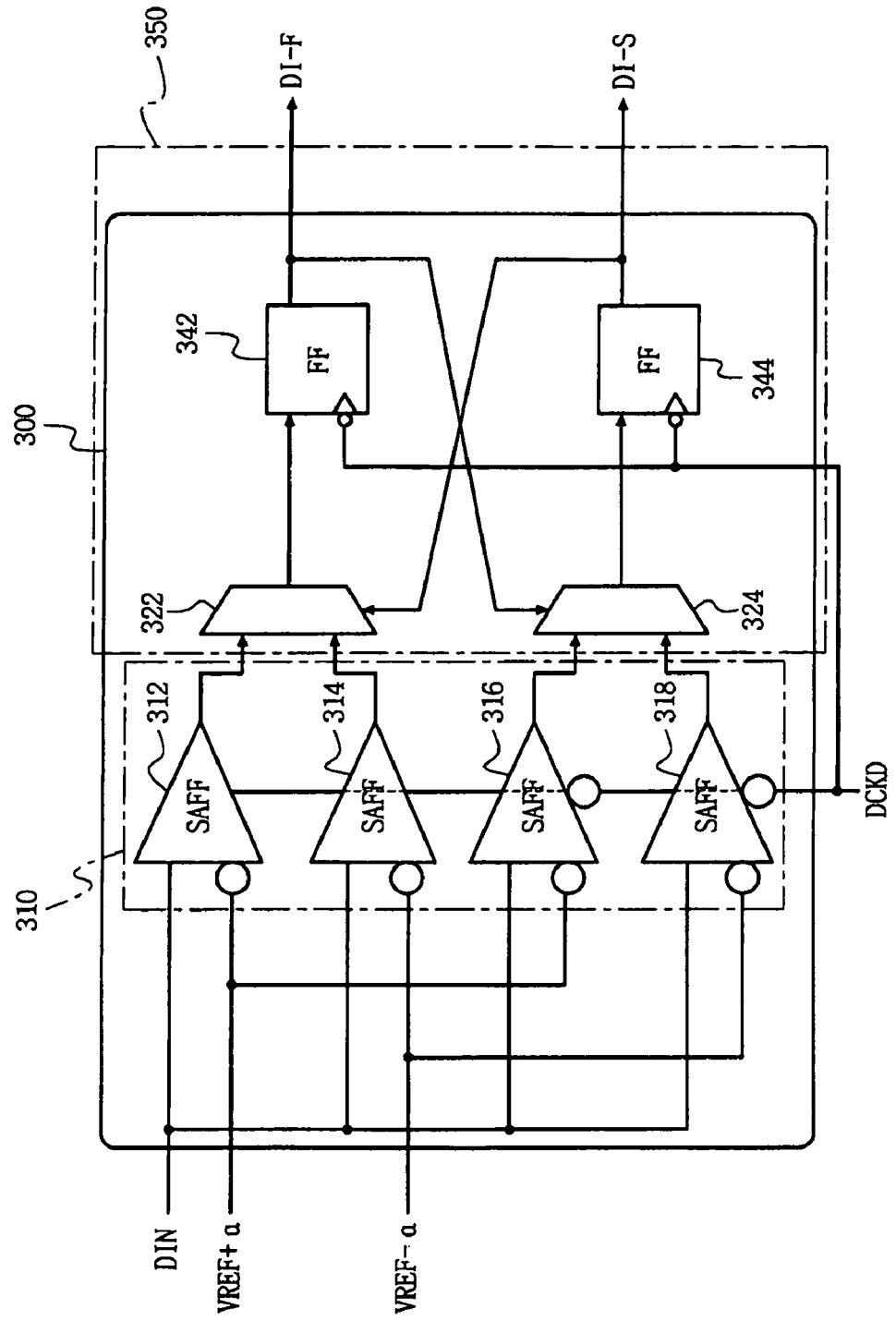
FIGS. 7 and 8 provide another embodiment of DFE unit referred to in FIGS. 1 and 5.
Figure 8:
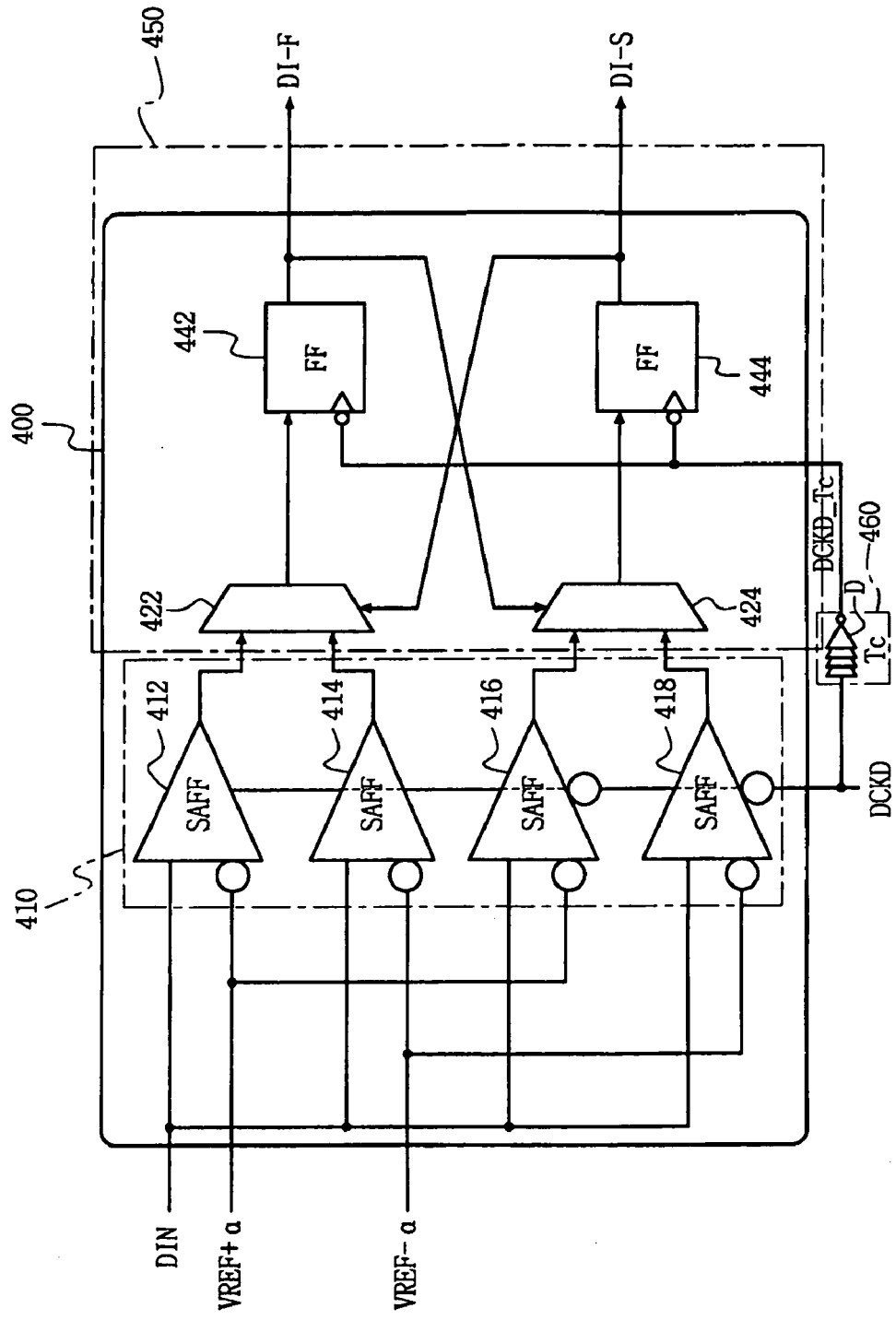

FIGS. 7 and 8 provide another embodiment of DFE unit 100 and 200 referred to in FIGS. 1 and 5. Though an initial value determining block like in FIG. 6 is not shown in FIGS. 7 and 8, the initial value determining block may be included therein.

As shown in FIG. 7, the DFE unit 300 comprises a sampling block 310 and a selection block 350. The sampling block 310 receives a plurality of sampling reference levels VREF+α and VREF−α having different levels in response to at least one sampling clock DCKD, and performs a sampling of the transmission data DIN. The sampling block 310 may comprise first to fourth samplers 312, 314, 316, and 318.

The first to fourth samplers 312, 314, 316, and 318 may have as a common input the transmission data DIN. Alternatively, sampling reference levels for the sampling or clocks may be different from one another. The first to fourth samplers 312, 314, 316, and 318 decide a level of data DIN input using a sampling reference level having a given standard, and then perform the sampling of the data.

FIG. 7 has an added configuration of flipflops 342 and 344 to the selection block 120 of the DFE unit 100 referred to FIG. 2. Thus, except the configuration of selection block 350, operation or configuration is substantially the same as that described above. Thus, a detailed description for the sampling block 310 is omitted and only the configuration of selection block 350 is described as follows.

The selection block 350 may comprise first and second MUXs 322 and 324 and first and second flipflops 342 and 344. The first MUX 322 selects and outputs any one output signal from output signals of the first sampler 312 and the second sampler 314 in response to an output signal of the second flipflop 344. The first flipflop 342 outputs an output signal of the first MUX 322 as an external output signal DI-F in response to the sampling clock DCKD. That is, an external output time point of an output signal of the first MUX 322 is controlled using the first flipflop 342.

The second MUX 324 selects and outputs any one output signal from output signals of the third and fourth samplers 316 and 318 in response to an output signal of the first flipflop 342. The second flipflop 344 outputs an output signal of the second MUX 324 as an external output signal DI-S in response to the sampling clock DCKD. That is, an external output time point of an output signal of the second MUX 324 is controlled using the second flipflop 344.

The conventional DFE circuit may have limited use due to a feedback delay. In other words, previous data D[n−1] should be processed and then fed back to process current transmission data. Therefore, time taken in the feedback of previous data must be limited to about 1 UI or below. To reduce such feedback delay, a loop-unrolling scheme like in FIG. 7 has been developed. In comparison with FIG. 2, FIG. 7 further includes the first and second flipflops 342 and 344, which are further configured such that an output of the DFE unit 300 is delayed by one bit as compared with FIG. 2. As a result, the limit from the feedback delay can be lessened.

However, even in a loop-unrolling DFE, a feedback delay may become a limit according to a characteristic of the sampler. Particularly in DRAM, operating frequencies can be various, and thus all kinds of frequencies should be considered.

In FIG. 7, the limit based on the feedback delay may be calculated as follows: "$t_{CLK2Q\_SA}+t_{MUX}+t_{SETUP\_FF}+t_{CLKSKEW}<1$ UI." Here, '$t_{CLK2Q\_SA}$' indicates a clock-to-delay of sampler, i.e., 312, '$t_{MUX}$' indicates a MUX delay, '$t_{SETUP\_FF}$' denotes a setup time of flipflop, i.e., 342, and '$t_{CLKSKEW}$' denotes a skew between clocks applied to respective components, particularly, skew between clocks applied to the sampler, i.e., 312, and a flipflop, i.e., 342.

Here, time of 1 UI may be reduced when an operating frequency of memory is relatively increased. For example, when it is assumed an operating frequency is 3.2 Gbps, 1 UI will be a very small value such as about 312.5 ps. Schematically, in an assumption that $t_{MUX}<100$ ps and $t_{SETUP\_FF}<50$ ps, and $t_{CLKSKEW}$ can be disregarded, an allowed clock-to-delay of sampler, i.e., 312, is about 160 ps. This is not impossible to realize in a general condition, but it is a very difficult value to realize when considering several process conditions and device mismatches, etc. For example, when an operating frequency increases to 5.0 Gbps, a clock-to-delay of allowed sampler, i.e., 312, is in the range of about tens of ps. Thus, a loop-unrolling DFE circuit of a type like in FIG. 7 is limited to use in a memory device having a high speed.

In FIG. 7, time taken from an input of transmission data DIN to sampler, i.e., 312, to an output of effective data from a flipflop, i.e., 342 (as a DFE processing delay) becomes "1 UI+$t_{CLK2Q\_FF}$." Here, '$t_{CLK2Q\_FF}$' indicates a clock-to-Q delay of a flipflop, i.e., 342.

And, in an assumption that an operating frequency of a semiconductor memory is changed from 1.6 Gbps to 3.2 Gbps, a processing delay is changed from 625 ps+$t_{CLK2Q\_FF}$ to 312.5 ps+$t_{CLK2Q\_FF}$. Thus, in a relatively slow operating frequency, more time is consumed.

FIG. 8 illustrates an embodiment of a DFE circuit or DFE unit 400 proposed to substantially reduce the limit based on an operating frequency of the DFE circuit like in FIG. 7 and the limit caused from a feedback delay. As shown in FIG. 8, the DFE unit 400 comprises a sampling block 410, a selection block 450 and a delay block 460.

In the DFE unit 400 shown in FIG. 8, a delay block 460 is further included. Except for the part related to the delay block 460, its operation or configuration is substantially the same as or similar to FIG. 7. That is, the configuration and operation of the sampling block 410 of the DFE unit 400 is substantially the same as that of the sampling block 310 of FIG. 7, and thus its description is omitted. Only the configuration of the selection block 450 and the delay block 460 are described as follows.

The selection block 450 comprises a first MUX 422, second MUX 424, first flipflop 442 and second flipflop 444. The first MUX 422 selects and outputs any one of output signals of the first and second samplers 412 and 414 in response to an output signal of the second flipflop 444. The first flipflop 442 outputs an output signal of the first MUX 422 as an external output signal DI-F in response to the sampling clock DCK-D_Tc obtained by delaying the sampling clock DCKD by a given delay Tc. That is, an external output time point of an output signal of the first MUX 422 is controlled using the first flipflop 442.

The second MUX 424 selects and outputs any one output signal from output signals of the third and fourth samplers 416 and 418 in response to an output signal of the first flipflop 442. The second flipflop 444 outputs an output signal of the second MUX 424 as an external output signal DI-S in response to the sampling clock DCKD_Tc obtained by delaying by a given delay Tc the sampling clock DCKD. That is, an external output time point of output signal of the second MUX 424 is controlled using the second flipflop 444.

The delay block 460 may fix and determine a desired delay by using a plurality of delay cells, or may be configured to control a delay level Tc through an external input. For example, the delay level may be controlled through at least one signal selected from an MRS signal, address signal, and command signal input externally, or through a combined signal of at least two signals among the signals.

The delay level Tc of the sampling clock DCKD may be controlled to have a proper delay value Tc in consideration of a clock-to-delay of a sampler, i.e., 412, and a delay of a MUX, i.e., 422. The clock-to-delay of a sampler, i.e., 412, as the feedback delay limit in FIG. 7, can be eliminated through the delay block 460 described above. In this case, the feedback delay limit may be calculated as follows: "$t_{CLK2Q\_FF}+t_{MUX}+t_{SETUP\_FF}+t_{CLKSKEW}<1$ UI." Here, '$t_{CLK2Q\_FF}$' indicates a clock-to-delay of a flipflop, i.e., 442, '$t_{MUX}$' denotes a MUX delay, '$t_{SETUP\_FF}$' indicates setup time of a flipflop, i.e., 442, and '$t_{CLKSKEW}$' designates a skew between clocks applied to respective components, particularly, skew between clocks applied to the sampler, i.e., 412, and a flipflop, i.e., 442.

Here, a clock-to-delay of flipflop having a smaller clock-to-delay as compared to a clock-to-delay of a sampler, i.e., 412, is used in a feedback delay condition of a DFE. Thus, a range of larger operable frequency increases. Since an input signal of a sampler, i.e., 412, has a small swing width, time is taken in its amplification. Thus, the clock-to-delay is greater than the flipflop, i.e., 442.

Further, FIG. 8 may be applied to cases of general-purpose memory devices to process various operating frequencies. The processing delay in FIG. 7 requires "1 UI+$t_{CLK2Q\_FF}$," meanwhile, the processing delay in FIG. 8 may be decided as "Tc+$t_{CLK2Q\_FF}$" regardless of frequency. Therefore, when the embodiment shown in FIG. 8 is applied to a semiconductor memory device having a relatively slow operating frequency, a timing margin can increase. In addition, when a delay level Tc is appropriately determined corresponding to a clock-to-delay of a sampler, i.e., 412, being changed, or a MUX delay, etc., caused by a process, voltage, temperature (PVT) change, a DFE circuit with the structure less sensitive to the change of clock-to-delay of the sampler can be realized herein.

As described above, according to some embodiments of the invention, a data sampling error can be prevented or substantially reduced through an initialization of previous data in a DFE circuit. Additionally, a feedback delay can be substantially lessened.

Accordingly, these and other changes and modifications are seen to be within the true spirit and scope of the invention as defined by the appended claims. In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A Decision Feedback Equalizer (DFE) circuit for use in a semiconductor memory device for which a data channel having a discontinuous transmission of data is terminated at a predefined termination level, comprising:
   a DFE unit configured to sample transmission data according to a sampling reference level that is configured to change responsive to a level of previous data; and
   a sampling time point control unit configured to control a sampling start time point of the transmission data of the DFE unit to have a sampling start time point preceding a transmission time point of the transmission data by at least 1-bit sampling time, wherein the sampling time point control unit is configured to perform an initialization of the previous data by sampling the termination level before sampling of the transmission data.

2. The circuit of claim 1, wherein the I-bit sampling time corresponds to 0.5 clock cycle time.

3. The circuit of claim 1, wherein the sampling time point control unit is configured to control the sampling start time point of the transmission data responsive to at least one of a mode register set (MRS) signal, an address signal, and a command signal that are input externally.

4. The circuit of claim 1, wherein the termination level is one of a power voltage level and a ground voltage level.

5. The circuit of claim 1, wherein an initialization level of the previous data has a level equal or approximate to the termination level.

6. The circuit of claim 1, wherein the termination level is a specific level existing between the power voltage level and the ground voltage level.

7. The circuit of claim 1, wherein the DFE circuit is configured to transmit a predefined level of initialization data through the data channel prior to a transmission of the transmission data, thereby initializing the previous data.

8. The circuit of claim 1, wherein the DFE unit comprises:
   a sampling block configured to select the sampling reference level corresponding to the previous data among a plurality of sampling reference levels of different levels responsive to at least one sampling clock, and to perform a sampling of the transmission data; and
   a selection block configured to select at least one output from a plurality of outputs of the sampling block, and to transmit the selected output as an output of the DFE unit.

9. The circuit of claim 8, wherein the sampling block comprises a plurality of samplers, the plurality of samplers including:
   a first sampler configured to perform a sampling of the transmission data using a first sampling reference level having a first predefined standard responsive to a first sampling clock;
   a second sampler configured to perform a sampling of the transmission data using a second sampling reference level having a second predefined standard that is lower than the first sampling reference level having the first predefined standard responsive to the first sampling clock;
   a third sampler configured to perform a sampling of the transmission data using the first sampling reference level having the first predefined standard responsive to a second sampling clock having a given phase difference from the first sampling clock; and
   a fourth sampler configured to perform a sampling of the transmission data using the second sampling reference level having the second predefined standard responsive to the second sampling clock.

10. The circuit of claim 8, wherein the selection block comprises at least first and second MUXs, the first MUX configured to select and output anyone output signal from output signals of the first and second samplers responsive to an output signal of the second MUX; and the second MUX being configured to select and output anyone output signal from output signals of the third and fourth samplers responsive to an output signal of the first MUX.

11. The circuit of claim 10, wherein the DFE unit further comprises an initial value determining block directly coupled to the first MUX and that is configured to initialize the previous data only at a first bit input time point of the transmission data.

12. The circuit of claim 8, wherein the selection block comprises at least first and second MUXs and first and second flipflops, and wherein:
   the first MUX is configured to select and output anyone output signal from output signals of the first and second samplers responsive to an output signal of the second flip-flop,
   the first flipflop is configured to control an external output time point of the output signal of the first MUX responsive to the first sampling clock,
   the second MUX is configured to select and output anyone output signal from output signals of the third and fourth samplers responsive to an output signal of the first flip-flop, and
   the second flipflop is configured to control an external output time point of the output signal of the second MUX responsive to the first sampling clock.

13. The circuit of claim 12, wherein the DFE unit further comprises a delay block configured to delay by a predefined delay the sampling clock input to the first and second flip-flops.

14. A Decision Feedback Equalizer (DFE) circuit for use in a semiconductor memory device transmitting transmission data through a data channel having a predefined termination level which is a voltage level when transmission of previous data has been terminated, comprising:
   a DFE unit configured to sample the transmission data by using sampling reference levels according to a level of the previous data estimated from the predefined termination level; and
   a sampling time point control unit configured to provide a sampling clock to the DFE unit from a time point at which the voltage level of the data channel is sampled to obtain the predefined termination level, the time point preceding a sampling start time point, at which sampling of the transmission data starts, by at least 1-bit sampling time.

15. A DFE circuit for use in a semiconductor memory device for which a data channel having a discontinuous transmission of data is terminated at a predefined termination level, the circuit comprising:
   a DFE unit configured to sample transmission data according to a sampling reference level that is configured to change responsive to a level of previous data; and
   a sampling time point control unit configured to control a sampling start time point of the transmission data of the DFE unit to have a time point preceding a transmission time point of the transmission data by at least 1-bit sampling time, wherein the sampling time point control unit is configured to perform an initialization of the previous data by sampling the termination level before sampling of the transmission data, wherein the DFE unit comprises:
at least two samplers that are configured to perform a sampling of transmission data using sampling reference levels having predefined mutually different standards that are selected corresponding to a level of previous data, the at least two samplers operating responsive to a sampling clock;
at least one MUX configured to be controlled by a feedback of an external output signal of the DFE circuit, the at least one MUX being configured to select and output anyone of output signals of the at least two samplers;
at least one flipflop configured to control an external output time point of an output signal of the at least one MUX, and to output it as the external output signal of the DFE circuit, responsive to the sampling clock delayed by a predefined delay; and
a delay block configured to control a delay of the sampling clock using an external control.

16. The circuit of claim 15, wherein the I-bit sampling time corresponds to 0.5 clock cycle time.

17. The circuit of claim 15, wherein the sampling time point control unit is configured to control the sampling start time point of the transmission data responsive to at least one of an a mode register set (MRS) signal, an address signal, and a command signal that are input externally.

* * * * *